US009910102B2

(12) United States Patent
Stoupis et al.

(10) Patent No.: US 9,910,102 B2
(45) Date of Patent: Mar. 6, 2018

(54) METHODS, SYSTEMS, AND COMPUTER READABLE MEDIA FOR MONITORING AND MANAGEMENT OF A POWER DISTRIBUTION SYSTEM

(71) Applicant: ABB Schweiz AG, Baden (CH)

(72) Inventors: James D. Stoupis, Raleigh, NC (US); Mirrasoul J. Mousavi, Cary, NC (US)

(73) Assignee: ABB Schweiz AG (CH)

( * ) Notice: Subject to any disclaimer, the term of this patent is extended or adjusted under 35 U.S.C. 154(b) by 346 days.

(21) Appl. No.: 14/549,515

(22) Filed: Nov. 20, 2014

(65) Prior Publication Data
US 2016/0147209 A1 May 26, 2016

(51) Int. Cl.
*G06F 19/00* (2011.01)
*G01R 31/40* (2014.01)
*H02J 13/00* (2006.01)

(52) U.S. Cl.
CPC .......... *G01R 31/40* (2013.01); *H02J 13/0013* (2013.01); *Y02E 60/7807* (2013.01); *Y04S 40/12* (2013.01)

(58) Field of Classification Search
USPC .......................................................... 700/295
See application file for complete search history.

(56) References Cited

U.S. PATENT DOCUMENTS

| | | | | |
|---|---|---|---|---|
| 4,661,308 A * | 4/1987 | Takenaka | ............. | G21C 17/003 307/66 |
| 4,818,990 A * | 4/1989 | Fernandes | ............. | G01R 15/14 340/12.32 |
| 4,904,996 A * | 2/1990 | Fernandes | ............. | G01R 15/142 340/601 |
| 6,002,260 A * | 12/1999 | Lau | ............. | G01R 15/142 324/509 |
| 6,259,972 B1 * | 7/2001 | Sumic | ............. | H02H 1/0092 700/286 |
| 6,909,942 B2 * | 6/2005 | Andarawis | ............. | G06F 1/12 361/679.01 |
| 7,543,780 B1 * | 6/2009 | Marshall | ............. | B64C 39/024 244/110 G |
| 8,000,913 B2 * | 8/2011 | Kreiss | ............. | H02J 3/14 324/512 |

(Continued)

OTHER PUBLICATIONS

Brown et al., Failure Rate Modeling Using Equipment Inspection Data, May 2, 2004, IEEE, vol. 19, No. 2, p. 782-787.*

(Continued)

*Primary Examiner* — Kidest Bahta
(74) *Attorney, Agent, or Firm* — Taft Stettinius & Hollister LLP

(57) ABSTRACT

Methods, systems, and computer readable media for monitoring and management of a power distribution system are disclosed. In one example, the method includes receiving sensory measurement data captured by a mobile inspection device during an inspection of power distribution system elements in a power distribution system. The method further includes processing the received sensory measurement data to derive fault identification data that indicates a fault condition existing in one or more of the power distribution system elements and utilizing the derived fault identification data to update a network model of the power distribution system.

21 Claims, 4 Drawing Sheets

(56) References Cited

U.S. PATENT DOCUMENTS

| | | | | |
|---|---|---|---|---|
| 8,077,049 | B2* | 12/2011 | Yaney | G08B 25/06 340/511 |
| 8,505,461 | B2* | 8/2013 | Phillips | H02G 1/02 104/112 |
| 2007/0213956 | A1* | 9/2007 | Nasle | G06F 17/5009 702/182 |
| 2007/0270114 | A1* | 11/2007 | Kesler | H02H 3/006 455/187.1 |
| 2008/0284585 | A1* | 11/2008 | Schweitzer, III | H04Q 9/00 340/539.3 |
| 2009/0234512 | A1* | 9/2009 | Ewing | H04L 12/10 700/295 |
| 2011/0192315 | A1* | 8/2011 | Phillips | H02G 1/02 104/112 |
| 2011/0270550 | A1* | 11/2011 | Kreiss | G06Q 50/06 702/60 |

OTHER PUBLICATIONS

Miguel et al., Wireless Distributed Control For Power Line Inspection Robot, 2014, Robotics, pp. 517-524.*
Deng etal., Unmanned Aerial Vehicles for power Line Inspection: A Cooperative Way in Platforms and Communications, Sep. 2014, Sichuan University, p. 687-692.*
Luis et al., Power Line Inspection Via an UnmannedAerial System Based on the Quadrotor Helicopter, Apr. 16, 2014, Luis Enrique Gonzalez-Jimenez, pp. 393-397.*
Brendan Gates, A power Line inspection device, May 2013, University of Maine, p. 1-117.*
Decision to Grant for Swedish Patent Application No. 1551351-8 (dated Feb. 28, 2017)
Notice of Allowance for Swedish Patent Application No. 1551351-8 (dated Oct. 19, 2016).

* cited by examiner

METHODS, SYSTEMS, AND COMPUTER READABLE MEDIA FOR MONITORING AND MANAGEMENT OF A POWER DISTRIBUTION SYSTEM

TECHNICAL FIELD

The subject matter described herein relates to the management and maintenance of power utility distribution systems via the use of mobile inspection devices. More particularly, the subject matter described herein relates to methods, systems, and computer readable media for monitoring and management of a power distribution system.

BACKGROUND

At present, a significant amount of outage management information received by power utilities is typically derived from trouble calls originating from customers. Upon receipt of such calls, field technicians are typically deployed by the power utility to the reported area(s) to conduct an inspection of the distribution lines and other distribution system elements. Notably, even if a problem associated with distribution lines is promptly identified (e.g., by field technicians and/or robotic inspection devices), the related inspection data gathered by the utility is generally segregated from a central outage management system or other communication-based utility field systems (e.g., supervisory control and data acquisition (SCADA) systems) configured to utilize the data. For example, the mobile inspection devices or systems presently employed by utilities to inspect the distribution lines are typically provisioned with a communications means that is unable to provide the aforementioned management systems prompt access to the captured inspection data. Accordingly, there exists a need for providing enhanced monitoring and management of a power distribution system.

SUMMARY

According to one aspect, the subject matter described herein relates to, methods, systems, and computer readable media for monitoring and management of a power distribution system. In one embodiment, the method includes receiving sensory measurement data captured by a mobile inspection device during an inspection of power distribution system elements in a power distribution system. The method further includes processing the received sensory measurement data to derive fault identification data that indicates a fault condition existing in one or more of the power distribution system elements and utilizing the derived fault identification data to update a network model of the power distribution system.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

In accordance with the subject matter disclosed herein, methods, systems, and computer readable media for providing enhanced monitoring and management of a power distribution system are provided. The disclosed subject matter is directed to an end-to-end automated data analysis and communications system where inspection data is processed and transmitted to a central utility control center for updating a power distribution system network model (e.g., a network model of a power grid). Specifically, the disclosed manner of processing captured sensory measurement data and provisioning the fault inspection data (which is derived from the sensory measurement data) significantly enhances the management process related to existing power outages occurring in the power distribution system. As a result, the disclosed subject matter can effectively reduce outage times experienced by customers and increase the overall reliability of the power distribution system. Moreover, the prompt identification of power outage locations afforded by the disclosed subject matter may enhance safety conditions for field technicians and customers alike, which is especially important in storm situations where distribution line outages are increasingly prevalent. For example, in the context of condition-based maintenance (CBM) and post-storm damage assessment, a robot-assisted inspection approach safely facilitates the energized circuit inspection data gathering and analysis process.

Reference will now be made in detail to exemplary embodiments of the present disclosed subject matter, examples of which are illustrated in the accompanying drawings. Wherever possible, the same reference numbers will be used throughout the drawings to refer to the same or like parts.

Figure 1:
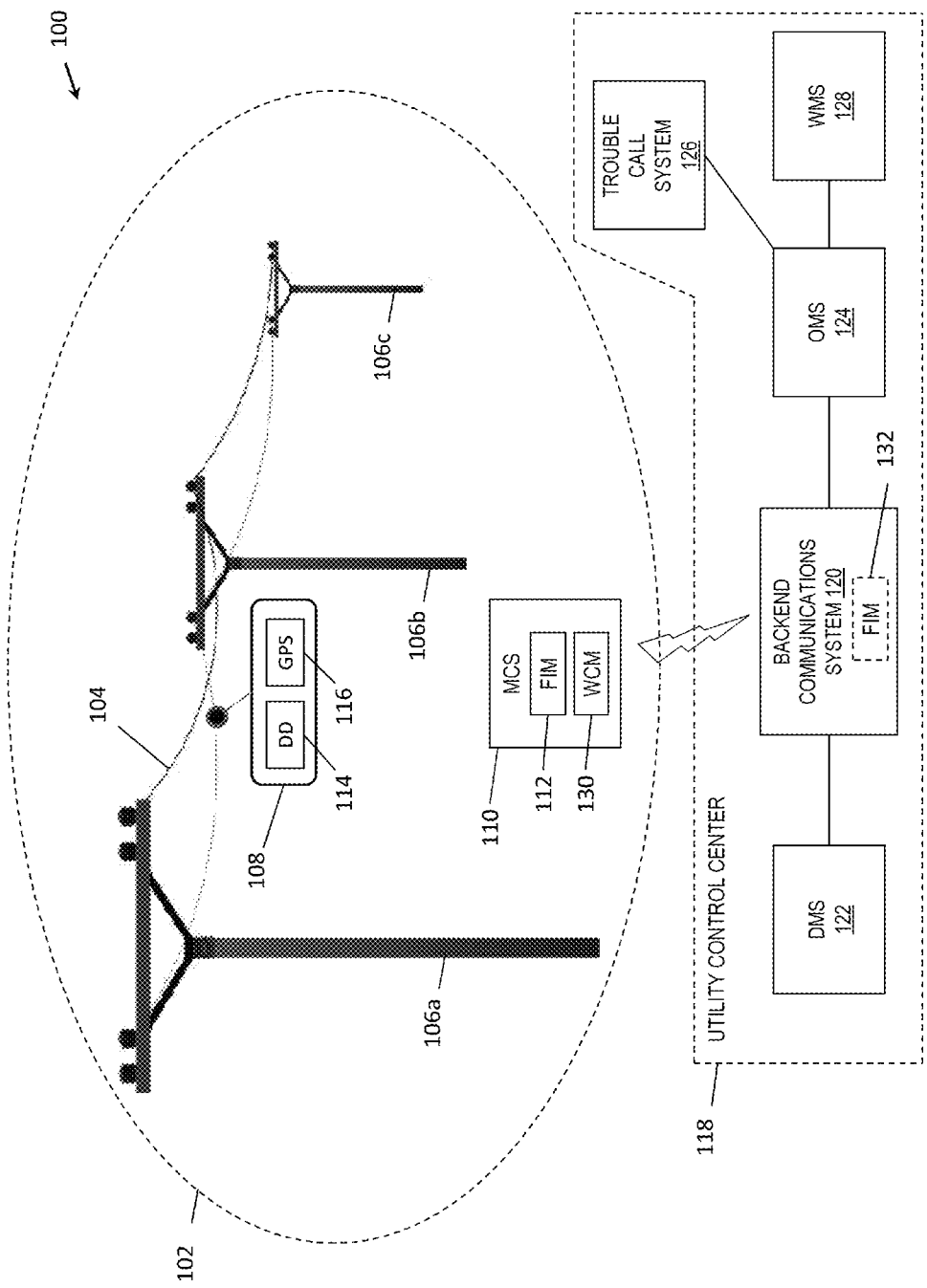
FIG. 1 is a block diagram illustrating an exemplary system for monitoring and management of a power distribution system according to an embodiment of the subject matter described herein.

FIG. 1 is a block diagram illustrating an exemplary electricity network system 100 for providing enhanced monitoring and management of a power distribution system according to an embodiment of the subject matter described herein. In the embodiment illustrated in FIG. 1, system 100 includes a power distribution system 102 that comprises, among other system components, distribution lines 104 supported by a plurality of utility poles 106a-c. In some embodiments, each of distribution lines 104 may comprise any type of distribution conductor line that is capable of conducting electricity among residential areas, substations, and power plants/farms. In alternate embodiments, each of distribution lines 104 may comprise any transmission line capable of carrying a communication signals (e.g., radio frequency signal currents) without departing from the scope of the disclosed subject matter.

As shown in FIG. 1, system 100 also includes a central utility control center 118 comprising a backend communications system (BCS) 120, a distribution management system (DMS) 122, an outage management system (OMS) 124, a trouble call system 126 (and/or an advanced metering infrastructure (AMI) system), and a work management system 128, each of which are described in more detail below. In some embodiments, each of systems 120-128 may comprise a software module that is supported by one or more host computer servers included in utility control center 118. It should be noted that each of systems 120-128 described herein may constitute a special purpose computer that improves the technological field of power utility systems by providing a mechanism for monitoring and communicating outage data between a power distribution system and a central utility control system. Although the following description pertains to the power utility industry, any other industry (e.g., cable television) that similarly employs overhead distribution lines may utilize the disclose subject matter. Moreover, although FIG. 1 depicts two distribution lines 104 and three utility poles 106a-c, any number of distribution lines and utility poles may be positioned throughout power distribution system 102 (e.g., a power network) without departing from the scope of the disclosed subject matter.

As depicted in FIG. 1, power distribution system 102 may further include a mobile inspection device 108 and a mobile control station 110, each of which may be utilized by a field technician to inspect and assess the operational status of power distribution system 102. In some embodiments, mobile control station 110 can include a laptop computer, a computer tablet, a mobile smartphone, a local control station (e.g., a laptop computer equipped with a high power antenna), or any other like computing device that is capable of wirelessly communicating with both mobile inspection device 108 and a central utility control center 118 (as described below). Notably, mobile control station 110 may be provisioned with a wireless communication module 130 that enables mobile control station 110 to wirelessly communicate with both mobile inspection device 108 and utility control center 118 (via BCS 120). For example, wireless communication module 130 may comprise any chipset and/or software component that allows mobile control station 110 to transmit and receive wireless signal data (e.g., cellular data, WiFi data, or other RF data).

In some embodiments, mobile inspection device 108 may include any robotic or mechanized mobile device that is utilized to conduct inspections of distribution lines 104 by using attached data capture equipment and/or detection device(s) 114. One exemplary mobile inspection device includes a distribution line inspection robot (e.g., a mobile line "crawling" robot) that is configured to traverse an overhead distribution wire 104 and wire junctions at utility poles 106a-c as depicted in FIG. 1. An example of a line crawling robot may be found in U.S. Pat. No. 8,505,461, which is herein incorporated by reference in its entirety. In alternative embodiments, mobile inspection device 108 may include a quadcopter or drone device that is controlled or programmed (e.g., using GPS coordinates) to fly over and/or proximate to distribution lines 104. Regardless of the specific embodiment, mobile inspection device 108 can be equipped with one or more detection devices 114 such as a standard definition camera, a high definition (HD) camera, a video camera, an infrared and/or thermal sensor device or camera, an acoustic signal capturing device, multi-meter device, and the like. Notably, detection device(s) 114 may be configured to capture sensory measurement data comprising image data, video data, thermal image data, and sound data corresponding to the power distribution system elements (e.g., conductor lines, transformers, arresters, etc.) while mounted or incorporated within mobile inspection device 108. For example, the sensory measurement data captured by detection device(s) 114 may reveal compromises to the physical integrity of the distribution line caused by electrical, mechanical, and/or thermal stress factors. Exemplary complications experienced by the distribution lines may include insulation material degradation, conductor wire material degradation, breakage or disconnection of the conductor line (e.g., caused by material degradation, fallen tree limbs, ice accumulation, and/or fallen utility poles). In some embodiments, detection device 114 can also be equipped with a multi-meter device that is adapted to measure any number of electrical parameters, such as voltage and/or current, associated with the distribution line. For example, such a detection device 114 included in mobile inspection device 108 may be configured capture voltage and/or current measurement data either by contact or via a contactless manner. Notably, irregular voltage and/or current measurements may serve as an indication of a degraded or compromised electrical component.

In some embodiments, mobile inspection device 108 may also be equipped with a global positioning system (GPS) module 116 that is configured to receive satellite data signals from GPS satellites and determine the GPS latitude and longitude coordinates of its current position. Such capability may be useful for applications where mobile inspection device 108 is programmed to follow a designated path (e.g., quadcopter path programming) or where mobile inspection device 108 needs to be directed (e.g., via mobile control station 110) to locate a particular utility pole 106 that is mapped/associated with known GPS coordinates. In some embodiments, GPS module 116 may be utilized by detection device(s) 114 to "geo-tag" each captured sensory measurement.

After obtaining the sensory measurement data using detection device(s) 114, mobile inspection device 108 may utilize a communications module (not shown) configured to wirelessly transmit the gathered sensory measurement data to mobile control station 110. In alternate embodiments, mobile inspection device 108 may be configured to utilize the communications module to wirelessly transmit the sensory measurement data directly to BCS 120 in utility control center 118 for subsequent distribution and processing.

To illustrate an exemplary use of the disclosed subject matter in distribution system 102, mobile inspection device 108 may be utilized by a field technician to inspect the condition of distribution lines 104 (e.g., in response to a customer outage report). For example, the field technician may utilize a line-crawling mobile inspection device 108 to physically traverse distribution lines 104 as well as the junctions of utility poles 106 in order to conduct an inspection of the distribution line components. While traversing the conductor lines 104, mobile inspection device 108 may be configured to utilize detection device(s) 114 to conduct an inspection of the distribution line and other distribution system elements. As previously indicated, mobile inspection device 108 may use detection device(s) 114 to capture images and/or videos that may reveal one or more compromises to the physical integrity of distribution lines 104. In some embodiments, mobile inspection device 108 may initially inspect the power distribution system elements, such as overhead distribution power lines via high definition and infrared cameras and other sensors (e.g., audio sensors configured to detect electrical resonances, hums, or vibrations). In some embodiments, each of the sensory measurements captured by mobile inspection device 108 may be date/time-stamped by the respective detection device 114 or by some other component on board mobile inspection device 108. Similarly, GPS module 116 may be configured to geo-tag each sensory measurement taken by detection device(s) 114 using determined GPS coordinates corresponding to the mobile inspection device's position at the time sensory measurement data is captured.

Once obtained by mobile inspection device 108, the sensory measurement data and any associated metadata (e.g., date information, time information, GPS location information, etc.) may be transmitted via a wireless communication medium to mobile control station 110 (e.g., laptop, tablet, or local control station). In addition to being viewed by a field technician (optionally), the acquired sensory measurement data may be processed by mobile control station 110. For example, mobile control station 110 can utilize fault identification module 112, which may comprise intelligent algorithms configured to determine a current status (e.g., operational status, integrity status, etc.) associated with any power distribution system element (e.g., each of conductor lines 104 and associated components) being inspected by mobile inspection device 108. For example, fault identification module 112 may be configured to use the captured sensory measurement data as input to generate fault identification data (e.g., pertinent outage information) that may indicate, for example, whether a circuit component (e.g., an overhead conductor) is energized, indicate whether a mechanical failure or electrical failure exists, or indicate whether a pending failure due to a variety of stress factors leading to insulation degradation or other breakdown issues exists. Likewise, fault identification module 112 may further utilize the derived fault identification data to perform condition-based maintenance prioritization, predict incipient failure, identify system or component fault types, identify system or component fault locations, identify system or component fault causes, and the like. In some embodiments, the processed sensory measurement data may also be displayed on a screen of mobile control station 110 for visual inspection, interpretation, and analysis by a field technician.

After deriving fault identification data from the sensory measurement data, mobile control station 110 may transmit the fault identification data via a wireless communication medium to BCS 120. As used herein, BCS 120 may represent any centralized supervisory control center, such as a utility SCADA system, which is communicatively connected to mobile control stations and/or mobile inspection devices in distribution system 102. In some embodiments, mobile control station 110 can be provisioned with wireless communications module 130 that enables mobile control station 110 to communicate fault identification data to BCS 120 via a cellular service channel or any other wireless communications mode (e.g., WiFi, satellite, etc.). Once received by BCS 120, the fault identification data may be transferred to each of DMS 122 and OMS 124. In some alternate embodiments, BCS 120 may instead receive sensory measurement data directly from mobile inspection device 108 and subsequently derive the fault identification data locally (e.g., using an optional FIM 132 and thereby bypassing the use of a local FIM 112 in mobile control station 110).

Figure 2:
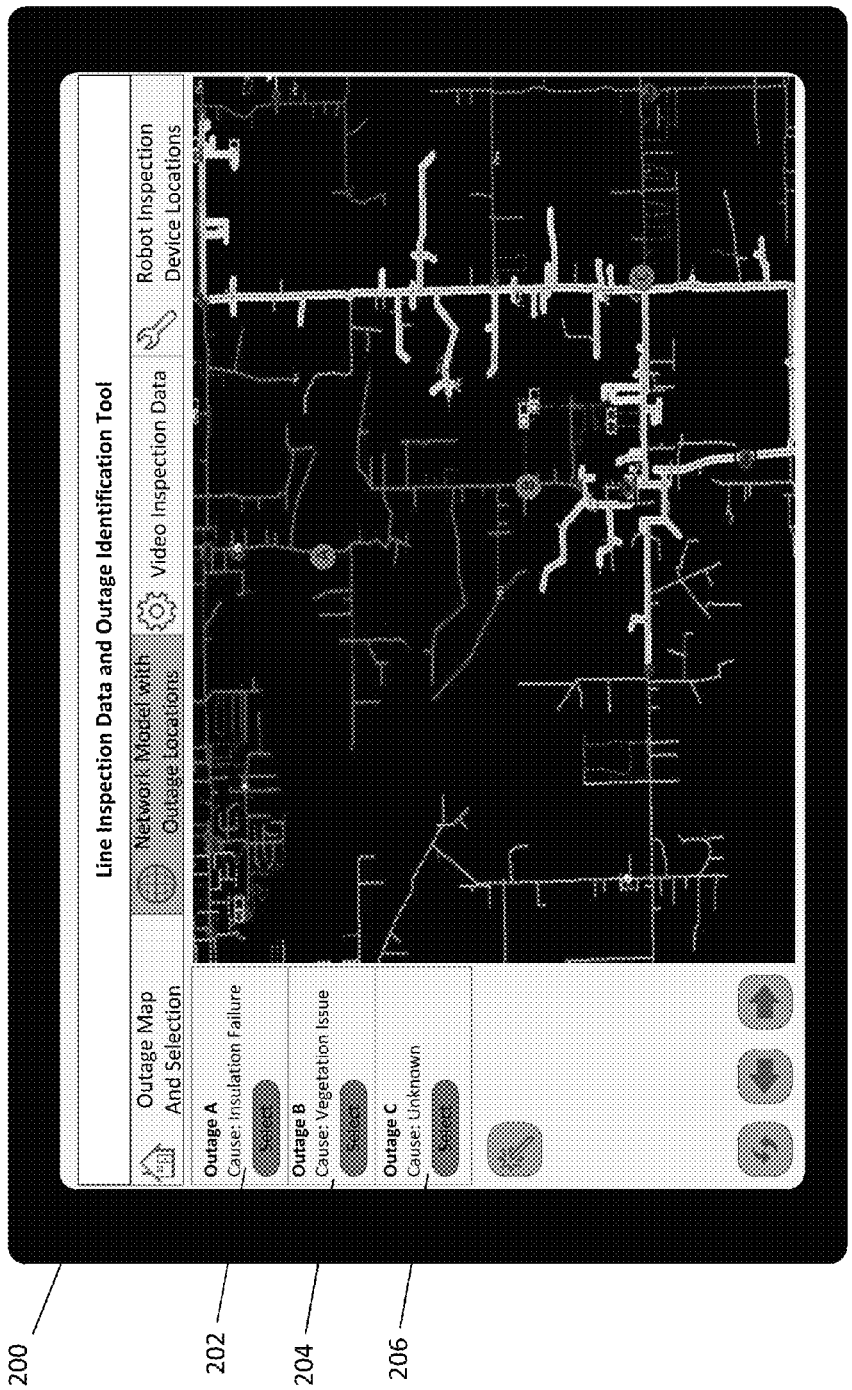
FIG. 2 is an illustration of a screen display of a distribution system network model according to an embodiment of the subject matter described herein.

After obtaining the fault identification data (e.g., either from station 110 or processing locally), BCS 120 may forward the information to DMS 122. As used herein, DMS 122 may include any system or device that is configured to support and manage a network model of power distribution system 102 that includes current outage information and the updated status of each distribution system element. For example, DMS 122 may utilize the received fault identification data to update the operational status of the power distribution system elements (e.g., a most recent operational status of grid component devices and conductor lines) in the network model that is representative of power distribution system 102. As a means of illustration, FIG. 2 depicts an exemplary network model screen display 200 that may be generated by DMS 122 and subsequently displayed on tablets and computer devices utilized by field technicians. Notably, display 200 depicts the screen of a tablet computer or laptop computer screen displaying a network model of the distribution system 102. Display 200 also exhibits current power outage locations. The current power outage locations shown on display 200 may be based on the received fault identification data in conjunction with trouble call information received from local customers. For example, user interface elements 202 and 204 of display 200 respectively indicate that outage area "A" is caused by an insulation failure and outage area "B" is caused by a vegetation issue. In both instances, display 200 may be utilizing fault identification information derived by mobile control station 110 (or processed locally at central utility control center 118 if mobile control station 110 is bypassed). Likewise, user interface element 206 of display 200 visually indicates that the cause of the outage in area "C" is unknown. Such an indication may have originated by a customer outage report call and/or visual confirmation by a field technician. Notably, the collaborative outage network model displayed by display 200 uses the fault identification data received from mobile inspection devices 108 and data received from customer report calls to provide a more comprehensive assessment with respect to the operational status of power distribution system 102.

Returning to FIG. 1, BCS 120 may also be configured in some embodiments to provide the fault identification data to health and maintenance systems (not shown) to conduct a system-based operational assessment. For example, the fault identification information may be selectively provided by BCS 120 to assist the health and maintenance systems conduct condition-based maintenance optimization measures and resource allocation. In some embodiments, the health and maintenance systems may be configured to store and archive the fault identification information for subsequent management optimization tasks. Notably, the archived fault identification data received from one or more mobile inspection devices 108 (e.g. via BCS 120) may be subsequently utilized by the health and maintenance systems to determine and assign a higher maintenance priority to customer areas that historically demonstrate a propensity to faults and disturbances (e.g., problematic customer areas including excessive foliage/trees or older infrastructure equipment).

As indicated above, BCS 120 may also be configured to provide the fault identification data to OMS 124. As used herein, OMS 124 may include any system or network device that serves to identify current power outages based on trouble call data accumulated and provided by trouble call center 126. Although FIG. 1 depicts trouble call center 126, utility control center 118 may instead include an advanced metering infrastructure (AMI) system that operates along with or in lieu of trouble call center 126 without departing from the scope of the present subject matter. For example, an AMI system may be configured to utilize smart meter devices to measure, collect, and analyze energy usage data as well as subsequently communicate said energy usage data to utility control center 118. Similarly, the smart meters utilized by an AMI system may also be configured to autonomously communicate a notification or alarm to utility control center 118 should an outage or other problematic scenario arise.

In some embodiments, the fault identification data can be linked, by the DMS 122, to outage data generated by OMS 124 in the event power outages occur due to disturbances, such as overhead line faults and storms. More specifically, the fault identification data may be used to complement trouble call data obtained from trouble call center 126. For example, OMS 124 may be configured to receive and process i) power outage identification information supplied by trouble call center 126 and/or AMI systems and ii) fault identification information provided by DMS 122. Notably, the utilization of information acquired by multiple sources enables OMS 124 to create a comprehensive overview map that effectively identifies all reported outages and faults. By generating a map display that incorporates OMS outage data and fault identification data, OMS 124 can expedite the manner in which a power utility can conduct damage assessments and, more importantly, expedite critical post-storm restoration efforts. In some embodiments, OMS 124 may forward the fault identification data and/or mapping information to WMS 120 for subsequent task management (e.g., task assignment, prioritization, updating, etc.). WMS 120 may then be configured to supply this data to utility maintenance technician crews as visual map information (e.g., via display 200 in FIG. 2) and/or listed tasks for completion (e.g., identified insulation failure at site A, problematic vegetation issue at site B, etc.).

Figure 3:
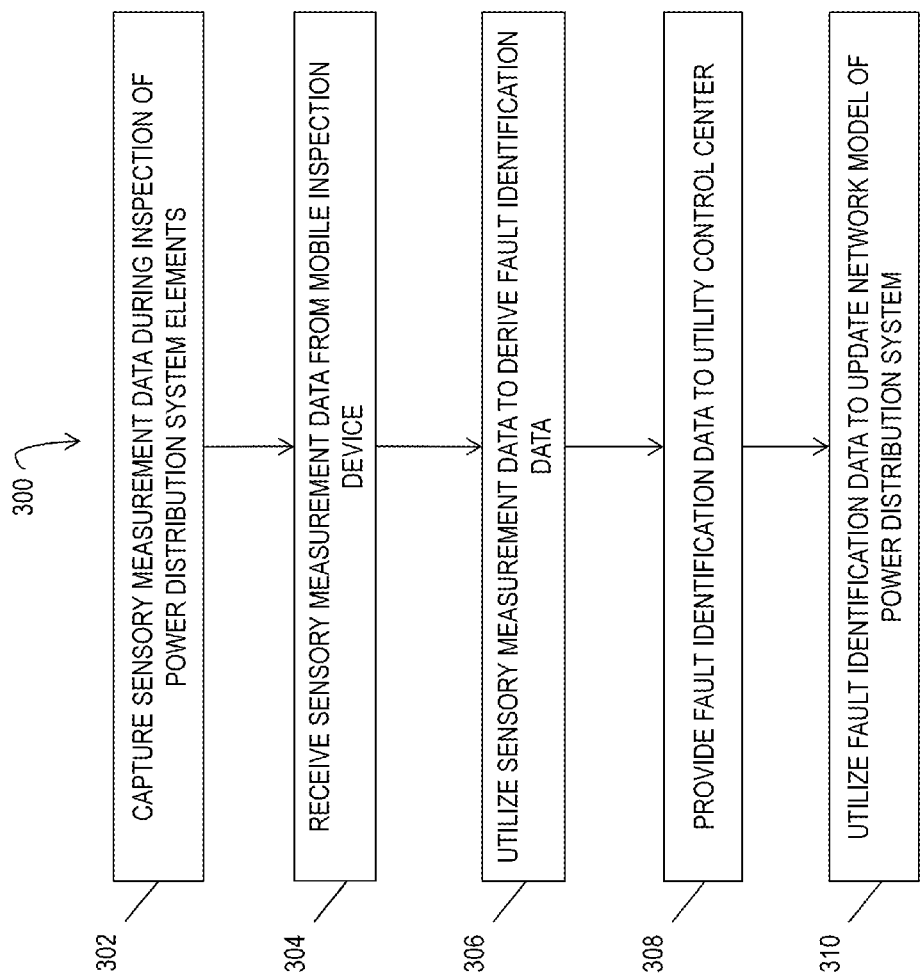
FIG. 3 is a flow chart illustrating an exemplary process for monitoring and management of a power distribution system according to an embodiment of the subject matter described herein.

FIG. 3 is a flow chart illustrating an exemplary method 300 for providing enhanced monitoring and management of a power distribution system according to an embodiment of the subject matter described herein. At step 302 of method 300, sensory measurement data is captured during the inspection of one or more power distribution system elements. In some embodiments, mobile inspection device 108 gathers sensory measurement data that includes, but not limited to, video data, image data, thermal data, and/or audio data of overhead distribution lines 104 and associated system components, such as transformers, arresters, cable vaults, insulators, and the like.

In step 304, the sensory measurement data is received from the mobile inspection device. In some embodiments, mobile control station 110 is configured to receive the sensory measurement data captured by mobile inspection device 108 via a wireless transmission (e.g., within WiFi range or some other radio frequency wireless range). Alternatively, mobile inspection device 108 may be configured with a communications module that is configured to use cellular communications or some other high powered radio transmission to communicate the sensory measurement data directly to BCS120 in the utility control center system.

In step 306, the sensory measurement data is utilized to derive fault identification data. In some embodiments, the captured sensory measurement data is processed by fault identification module 112 in mobile control station 110 to derive fault identification data. Notably, the software algorithms of fault identification module 112 may generate fault identification data that provides an indication of an existing failure or an impending failure of at least one distribution system element, such as a distribution line 104 or an associated component (e.g., transformer, arrester, cable vault, insulator, and the like). In the event a fault (or outage) has been detected and/or identified by mobile control station 110, fault identification module 112 may be further configured to record the failure type, the physical location of the failure (e.g., using GPS coordinates), the cause of the failure, and any other relevant information. In some alternate embodiments, BCS 120 may be equipped with fault identification module 132 in order to locally process the sensory measurement data into fault identification data (e.g., if mobile control station 110 is not used or bypassed). Although fault identification module 132 is depicted as residing in BCS 120 in FIG. 1, fault identification module 132 may also reside in either DMS 122 or OMS 124 without departing from the scope of the disclosed subject matter.

In step 308, fault identification data is provided to the utility control center. In some embodiments, mobile control station 110 may be configured to use wireless communications module 130 to communicate the fault identification data to BCS 120 via a wireless communication media (e.g., cellular, WiFi, or wireless broadband communications systems).

In step 310, the fault identification data is utilized to upgrade a network model of the power distribution system. In some embodiments, BCS 120 may be configured to send the fault identification data to DMS 122 and OMS 124. Notably, the received fault identification data may be utilized by DMS 122 to display the location of each current and pending outage on the distribution system network model (e.g., see display 200 in FIG. 2). In some embodiments, backend communications system 120 may be configured to send the derived fault identification data to WMS 128. WMS 128 may then process this data (alone or in conjunction with outage information received from OMS 126) to create and/or revise maintenance tasks assigned to service technicians deployed in the field. Notably, fault identification data may be utilized to update grid network model of the power distribution system and assign work orders to maintenance crews via WMS 128.

Figure 4:
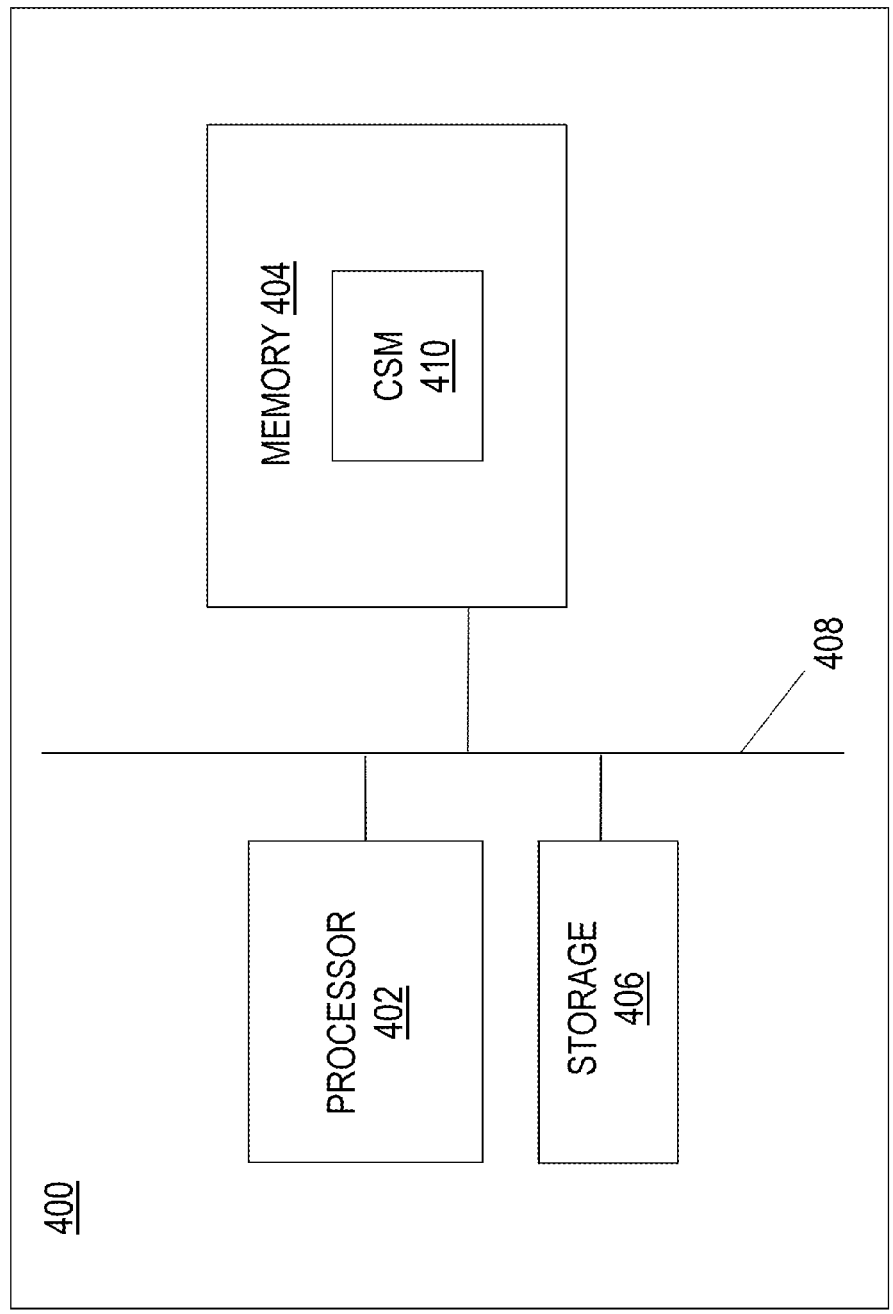
FIG. 4 is a high level block diagram of an exemplary general purpose computer system suitable for use in performing the functions described herein.

FIG. 4 depicts a high level block diagram of a general purpose computer system suitable for use in performing the functions described herein. As depicted in FIG. 4, system 400 includes a processor 402, a memory 404, and a storage device 406 communicatively connected via a system bus 408. In some embodiments, processor 402 can include a microprocessor, central processing unit (CPU), or any other like hardware based processing unit. In some embodiments, a fault identification module 410 can be stored in memory 404, which can include random access memory (RAM), read only memory (ROM), optical read/write memory, cache memory, magnetic read/write memory, flash memory, or any other non-transitory computer readable medium. In some embodiments, processor 402 and memory 404 can be used to execute and manage the operation of fault identification module 410. In some embodiments, storage device 406 can include any storage medium or storage unit that is configured to store data accessible by processor 402 via system bus 408. Exemplary storage devices can include one or more local databases hosted by system 400.

It will be understood that various details of the subject matter described herein may be changed without departing from the scope of the subject matter described herein. Furthermore, the foregoing description is for the purpose of illustration only, and not for the purpose of limitation.

What is claimed is:

1. A method for monitoring and management of a power distribution system including a plurality of power distribution lines and a plurality of power distribution devices, the method comprising:
operating a mobile inspection device including a sensor so as to traverse or fly proximally to one of the plurality of power distribution lines;
measuring a characteristic of the one power distribution line with the sensor of the mobile inspection device;
transmitting the sensor measurement data from the mobile inspection device to a mobile control device system;
determining, with the mobile control device, fault identification data including fault location and fault cause using the sensory measurement data from the mobile inspection device;
transmitting the fault identification data to a central utility control center including a non-transitory computer readable medium structured to store a power distribution network model, the power distribution network model including information corresponding to the connections between each of the plurality of power distribution lines and the plurality of power distribution devices, an operational status for each of the plurality of power distribution lines and the plurality of power distribution devices, and power outage information;
updating the power outage information of the power distribution network model using the fault identification data, the power outage information including an affected area of each power outage and outage cause;
generating a work order including at least one maintenance task using at least one of the fault identification data and the updated power distribution network model; and
transmitting the work order to a utility maintenance technician device.

2. The method of claim 1 wherein the updated network model is utilized by a distribution management system (DMS) station to display a location of one or more power outages occurring in the power distribution system.

3. The method of claim 1 wherein the updated network model is utilized by a distribution management system (DMS) station to display a most recent operational status for each of the power distribution devices in the power distribution system.

4. The method of claim 1 wherein the fault identification data is derived by a mobile control station that wirelessly receives the sensory measurement data from the mobile inspection device.

5. The method of claim 1 wherein the sensory measurement data includes at least one of image data, video data, thermal image data, and acoustic data captured by the mobile inspection device.

6. The method of claim 1 wherein the fault identification data is sent to at least one of an outage management system (OMS) or a work management system (WMS) that is configured to incorporate the fault identification data with trouble call data for display in the network model.

7. A system for monitoring and management of a power distribution system including a plurality of distribution lines and a plurality of power distribution system elements, the system comprising:
a mobile inspection device structured to traverse or fly proximally to the plurality of power distribution lines and including a sensor structured to capture sensory measurement data corresponding to electrical or physical characteristics of the power distribution system elements;
a mobile control station configured for receiving sensory measurement data captured by a mobile inspection device and for processing the received sensory measurement data to derive fault identification data that indicates a fault condition existing in one or more of the power distribution system elements, wherein the power distribution system elements include at least the power lines; and
a central utility control center including a distribution management system (DMS) station configured for receiving the derived fault identification data and for utilizing the derived fault identification data to update a network model of the power distribution system, the network model including information corresponding to the connections between each of the plurality of power distribution lines and the plurality of power distribution system elements, an operational status for each of the plurality of power distribution lines and the plurality of power distribution system elements, and power outage information,
wherein the DMS is configured to update the power outage information including power outage area and power outage cause using the derived fault identification data, and
wherein the central utility control center is configured to assign a work order including at least one maintenance task using at least one of the derived fault identification data and the updated power distribution network model, and transmit the work order to a remote technician device.

8. The system of claim 7 wherein the updated network model is utilized by the DMS station to display a location of one or more power outages occurring in the power distribution system.

9. The system of claim 7 wherein the updated network model is utilized by the DMS station to display a most recent operational status for each of the power distribution system elements in the power distribution system.

10. The system of claim 7 wherein the fault identification data is derived by the mobile control station, which is configured to wirelessly receive the sensory measurement data from the mobile inspection device.

11. The system of claim 7 wherein the sensory measurement data includes at least one of image data, video data, thermal image data, and acoustic data captured by the mobile inspection device.

12. The system of claim 7 wherein the fault identification data is sent to at least one of an outage management system (OMS) and a work management system (WMS) that is configured to incorporate the fault identification data with trouble call data for display in the network model.

13. A power distribution outage monitoring system comprising:
a mobile inspection device structured to traverse or fly proximally to power distribution lines in a power distribution system during an inspection of a plurality of power distribution system elements in the power distribution system wherein the plurality of power distribution system elements include at least the power lines;
a local mobile control station structured to receive sensory measurement data captured by the mobile inspection device, derive fault identification data that indicates a fault condition existing in one or more of the power distribution system elements using the received sensory measurement data, and transmit the fault identification data;

a central utility control center structured to receive the fault identification data, update a network model of the power distribution system, the network model including information corresponding to the connections between each of the plurality of power distribution system elements, an operational status for each of the plurality of power distribution system elements, and power outage information, wherein updating the network model includes updating the power outage information including power outage affected areas and power outage cause using the derived fault identification data, wherein the central utility control center is structured to generate a work order using the fault identification data and transmit the work order to a technician device, and wherein the technician device is structured to display a visual representation of a maintenance task in response to receiving the work order.

14. The central utility control center of claim 13 wherein the updated network model is utilized by a distribution management system (DMS) station to display a location of one or more power outages occurring in the power distribution system.

15. The central utility control center of claim 13 wherein the updated network model is utilized by a distribution management system (DMS) station to display a most recent operational status for each of the power distribution system elements in the power distribution system.

16. The central utility control center of claim 13 wherein the fault identification data is derived by a mobile control station that wirelessly receives the sensory measurement data from the mobile inspection device.

17. The central utility control center of claim 13 wherein the sensory measurement data includes at least one of image data, video data, thermal image data, and acoustic data captured by the mobile inspection device.

18. The method of claim 1 wherein the mobile inspection device includes a distribution line inspection robot configured to traverse the power distribution lines and associate wire junctions.

19. The method of claim 1 wherein the mobile inspection device includes a quadcopter device that is controlled or programmed to fly over the power distribution lines.

20. The system of claim 7 wherein the mobile inspection device includes a distribution line inspection robot configured to traverse the plurality of power distribution lines and associated wire junctions.

21. The system of claim 7 wherein the mobile inspection device includes a quadcopter device that is controlled or programmed to fly over the plurality of power distribution lines.

* * * * *